United States Patent [19]

Sakamoto et al.

[11] 3,837,002

[45] Sept. 17, 1974

[54] GLASS MOLD SEMICONDUCTOR DEVICE

[75] Inventors: Hisashi Sakamoto; Takeshi Sasaki; Satoshi Mikami; Yoichi Nakashima, all of Hitachi, Japan

[73] Assignee: Hitachi, Ltd., Tokyo, Japan

[22] Filed: May 2, 1973

[21] Appl. No.: 356,441

[30] Foreign Application Priority Data

May 12, 1972 Japan ................................ 47-46337

[52] U.S. Cl. ........................ 357/72, 357/73, 357/76, 106/39, 106/49, 106/53

[51] Int. Cl. ............................ H01l 3/00, H01l 5/00

[58] Field of Search .................. 317/234, 1, 3.1, 11; 106/39, 49, 53

[56] References Cited

UNITED STATES PATENTS

| | | | |
|---|---|---|---|
| 2,620,598 | 12/1952 | Purser et al. | 317/234 F |
| 2,920,971 | 1/1960 | Stookey | 317/234 F |
| 3,363,150 | 1/1968 | Whitman et al. | 317/234 F |
| 3,392,312 | 7/1968 | Carman | 317/234 F |
| 3,410,705 | 11/1968 | Honma | 317/234 F |
| 3,535,133 | 10/1970 | Akhtar | 317/234 F |

*Primary Examiner*—Andrew J. James
*Attorney, Agent, or Firm*—Craig & Antonelli

[57] ABSTRACT

A glass mold semiconductor device comprising a semiconductor pellet, a couple of electrodes disposed on both sides of the semiconductor pellet and a glass layer for covering the semiconductor pellet and at least part of the two of electrodes.

26 Claims, 5 Drawing Figures

GLASS MOLD SEMICONDUCTOR DEVICE

BACKGROUND OF THE INVENTION

1. Field of the Invention

This invention relates to a glass mold semiconductor device or more in particular to a glass mold semiconductor device provided with a laminated structure of a plurality of semiconductor pellets.

2. Description of the Prior Art

In a semiconductor device comprising semiconductor pellets of silicon or germanium, it is necessary to form a layer or passivation film, to dispose the semiconductor pellets in an inert gas, and to cover the pellets with resin or glass. This is because the surface of a semiconductor pellet of germanium or silicon is chemically active and easily affected by the atmosphere, and moisture or other easily ionized materials which may be present in the atmosphere tends to attach onto the surface of the semiconductor pellet, often causing an increase in leakage current and intensity of electric field in the surface of the pellet, resulting in a decreased breakdown voltage of the device. The resin or glass covering on the surface of the pellet is intended to prevent such undesirable phenomena to achieve the stability of the characteristics of the semiconductor device.

A semiconductor pellet covered with resin or glass has the advantage that the stability and mechanical protection of the surface of the semiconductor pellet are achieved at the same time. For this reason, the current trend is toward more and more semiconductor pellets of multi-purpose semiconductor devices being covered with resin or glass.

High-voltage semiconductor devices with the characteristics of high voltage and small current are used for a high-voltage power supply of electron microscopes, X-ray devices, television receivers and the like. In view of the ease with which such a high-voltage semiconductor device is assembled, it comprises a multiplicity of selenium rectifier plates and is formed into a laminated structure. The breakdown voltage of the rectification barrier of the device employing selenium rectifier plates, however, is lower than that of a silicon or germanium rectifier, which necessitates more rectification plates to be used to obtain a lamination with a predetermined breakdown voltage, resulting in the bulkiness of the semiconductor device. This is necessarily accompanied by a greater size of the high-voltage power supply circuit and hence the electron microscope or the like employing the high-voltage power supply in spite of the recent trend toward light weight and compactness which is the order of the day.

To meet such a demand, the commercial application has recently begun of a high-voltage semiconductor device comprising a laminated structure of a multiplicity of silicon or germanium rectification plates (hereinafter referred to as semiconductor pellets) in place of selenium rectification plates. Such a high-voltage semiconductor device comprises, for example, a rectifier unit consisting of a lamination of a multiplicity of semiconductor pellets each with a predetermined PN junction and a multiplicity of solder layers preferably of aluminium interposed therebetween to effect the bonding of the pellets, a couple of electrodes fixed on both ends of the rectifier unit and a mold resin material for convering both the rectifier unit and at least the rectifier unit side of the electrodes. This mold resin material is employed to achieve the stability and mechanical protection of the surface of the semiconductor pellet at the same time, as already explained. This mold resin material comprises the first resin on the side of the semiconductor pellet which is so elastic as to protect the semiconductor pellet from the adverse effect which otherwise might occur on the pellet due to the contraction of the resin at the time of hardening thereof and the second resin of higher mechanical strength covering the first resin. Silicon rubber and epoxy resin or silicon resin are suitable at the materials of the first and second resins, respectively. Epoxy resin or silicon resin has a much lower coefficient of thermal expansion than silicon rubber, and also the fact that the bonding power of silicon rubber is low results in isolation between the two layers during the operation of the semiconductor device. This isolation causes a short cut to be developed connecting the couple of electrodes, often leading to a lower creepage breakdown voltage. Further, since the mechanical strength of resin is smaller than that of glass, the mold resin material must be made thicker in order to provide a desired mechanical strength of the semiconductor device. The thicknening of the mold resin material, however, causes a much layer coefficient of thermal expansion of the mold resin material than that of the semiconductor pellet to contribute to the tensile strength to pull the rectifier unit toward its both sides, enhancing the risk of breakdown of the device.

Furthermore, since the mold resin material is incapable of being completely protected from the effect of moisture, its breakdown voltage is lowered when it is operated in a humid environment. This disadvantage is overcome by forming a water-proof or passivation film on the surface of the semiconductor pellet at the sacrifice of the advantage of resin covering.

All of these disadvantages are obviated by covering the rectifier unit and at least the rectifier unit side of the electrodes with glass. In covering glass on the rectifier unit, however, special attention must be paid to the problem of the difference in the coefficient of thermal expansion between the rectifier unit and glass. Due to this difference of the coefficients of thermal expansion between silicon and glass which are respectively $35.2 \times 10^{-7}/°C$ and $50 \times 10^{-7}/°C$, the amount of contraction of the rectifier unit is less than that of glass during the cooling of glass after the sintering thereof, so that relative tension is developed in the glass, thereby causing a crack therein. If aluminum is used as a soldering material to bond the silicon pellets with each other, the coefficient of thermal expansion of the rectifier unit becomes slightly closer to that of glass because of the coefficient of thermal expansion of aluminum which is as great as $277 \times 10^{-7}/°C$. An aluminum layer interposed between the pellets is, however, much thinner than a silicon pellet. In an example, the thickness of the aluminum layer is less than 10 microns while that of the pellet is 250 microns. Therefore, little if any portion of the difference between the coefficient of thermal expansion of the rectifier unit and that of glass is closed. As a result, the tension to which glass is subjected during the cooling thereof after its sintering causes a crack to be developed in the glass which is smaller in tensile strength. The cracking of glass leads to loss of the surface stability and mechanical protection of the same surface, that is to say, the loss of the functions of the high-voltage semiconductor device. It is for this reason that there is no high-voltage semiconductor device now in use in which a rectifier unit is covered directly with glass material.

SUMMARY OF THE INVENTION

An object of the invention is to provide a novel glass mold semiconductor device comprising a laminated structure of a plurality of semiconductor pellets.

Another object of the invention is to provide a novel glass mold semiconductor device in which the cracking of a glass material covering the plurality of semiconductor pellets is prevented.

A further object of the invention is to provide a novel glass mold semiconductor device with a high breakdown voltage and be operable with a small current.

Still another object of the invention is to provide a novel and economic glass mold semiconductor device with high mechanical strength.

The other objects of the invention will be made apparent from the detailed description of the invention which will be made later.

DESCRIPTION OF THE PREFERRED EMBODIMENTS

This invention is characterized in that a filling material or additive is added to the glass material covering the lamination or the rectifier unit comprising two or more semiconductor pellets to reduce the coefficient of thermal expansion of the glass material to a level as near as that of the rectifier unit. It is necessary that the glass material does not contain any alkali which adversely affects the characteristics of the semiconductor device, especially its PN junction and that the coefficient of thermal expansion of the glass material is as close to that of the semiconductor as possible. It is also necessary that the filling material be such that its addition to the glass material reduces the coefficient of thermal expansion of the glass material without adversely affecting the PN junction thereof. The glass material preferably consists of glass of the zinc borosilicate group as a main component comprising 60 to 70 percent by weight of zinc oxide, 19 to 25 percent of boron oxide and 10 to 16 percent of silicon oxide, which in all make up at least 90 percent of the glass material. In addition to the main component, the glass naturally contains several percent of lead oxide and aluminum oxide. The commercial products of such glass material now available on the market include 7574 No. (45) of Corning Inc. of U.S.A., 315 of GE Co., Ltd., U.S.A. and ASF1400 of Asahi Glass Co., Ltd., Japan. It is desirable to employ a filling material of granular substance of lead titanate, silica glass or the like.

Figures 1, 2:
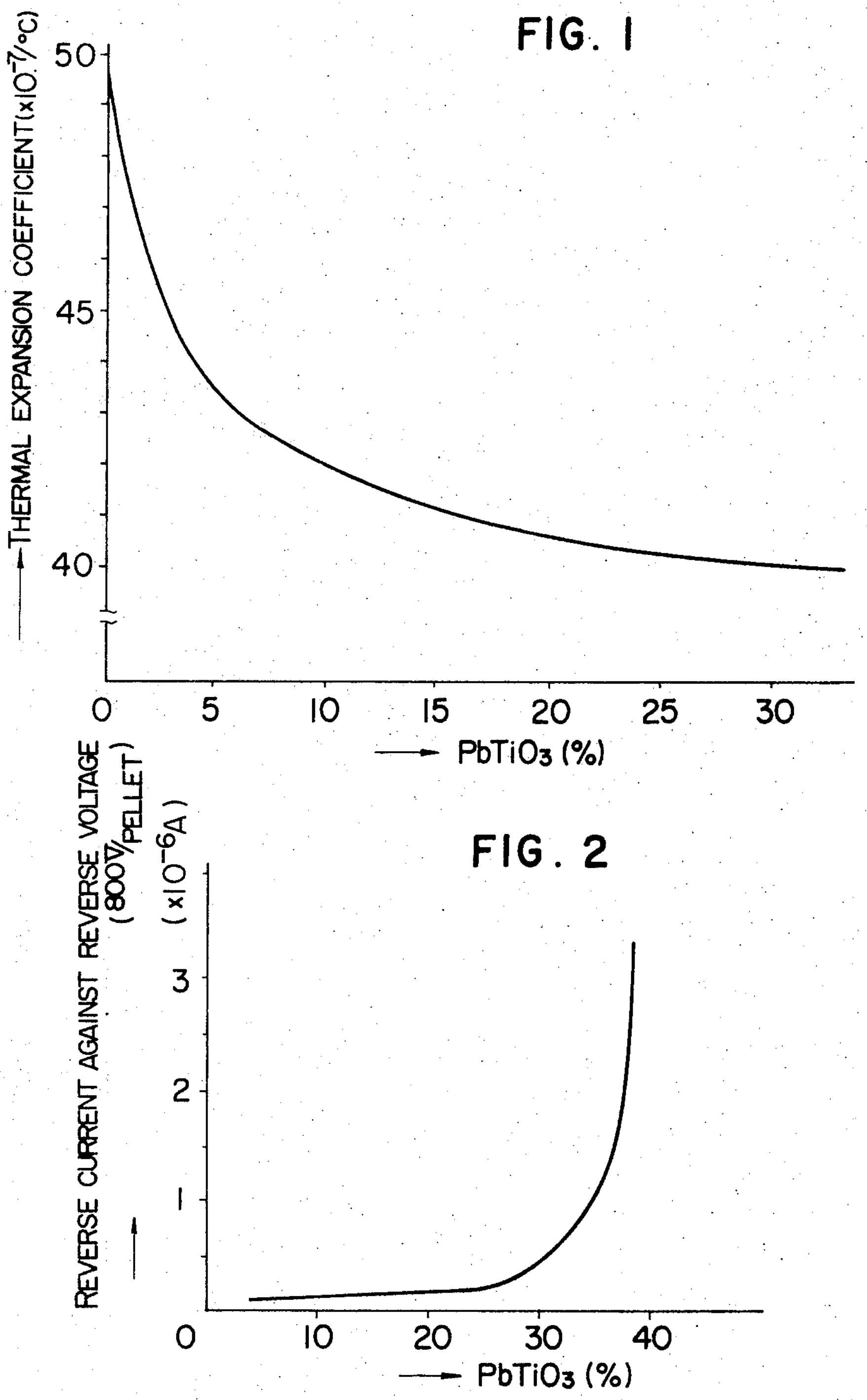
FIG. 1 is a characteristics diagram showing the relationship between the amount of lead titanate added to glass of the zinc borosilicate group and the coefficient of thermal expansion of the glass.
FIG. 2 is a characteristics diagram showing the relationship between the amount of lead titanate added to the glass of zinc borosilicate group used as a mold glass of a glass mold semiconductor device and the reverse current in the semiconductor device.

If lead titanate is used as a filling material, it is desirable that it should make up 5 to 30 percent of the glass material to which it is added. In particular, the distribution of grain sizes of lead titanate should be such that grains of lead titanate with a grain diameter of 5 microns or less and 50 microns or more represent 40 percent or less and 5 percent or less, respectively. The reasons for the above-mentioned requirements will be now explained. The characteristics diagram of FIG. 1 shows the changes in the coefficient of thermal expansion of the glass material to which 5 to 30 percent of lead titanate is added to the glass of zinc borosilicate group. As is apparent from the figure, the additive of 5 percent or less of lead titanate cannot achieve the satisfactory reduction of the coefficient of thermal expansion. The coefficient of thermal expansion of the glass material undergoes a greater change when 5 or more percent of filling material is added than when 5 or less percent thereof is added. As a result, it is obvious that the addition of 5 percent or more of the filling material makes it possible to obtain glass material of a desired coefficient of thermal expansion with a high reproducibility. If the ratio of filling material added exceeds 30 percent, the reduction of the coefficient of thermal expansion approximates zero, thus negative the effect of addition of the filling material. Another reason for addition of not more than 30 percent of filling material is to maintain the reverse current at low level. The graph of FIG. 2 shows the relationship between the amount of lead titanate added and the reverse current flowing in the glass mold semiconductor device. It will be noted from the figure that the reverse current is sharply increased when the amount of lead titanate exceeds 30 percent. The possible reason for the noted increase of current is the fact that a multiplicity of small pores are developed in the glass material after the sintering thereof, which pores constitute pin holes.

As can be seen from above, the amount of lead titanate to be added to the glass material should preferably be 5 to 30 percent of the amount of the particular glass material. More in particular, it is desirable that the lead titanate added to the glass material has such a grain size distribution that it contains not more than 40 percent of grains of 5 microns or less in grain diameter and not more than 5 percent of those with grain diamater of 50 microns or more. Thus, by dissolving in the glass material more of the lead titanate with the grain diameter of 5 microns or less, the property of the glass material itself changes and the amount of lead titanate contributing to the reduction in the coefficient of thermal expansion is substantially decreased, thereby eliminating part of the advantages attributable to addition of such material. The results of repeated tests by the inventors on an industrial scale show the necessity to limit the amount of lead titanate with the grain size of 5 microns or less within 40 percent or less. If lead titanate with the grain diameter of 5 microns or less exceeding 40 percent is used, cracks develop in the glass during the process of covering it on the rectifier unit or sintering the glass. Especially, when the amount of lead titanate with the grain diameter of 5 microns or less exceeds 60 percent, not less than 50 percent of the glass which is normally sintered develops cracks. When lead titanate with the grain diameter of 5 microns or less represents 40 to 60 percent, it is possible to maintain the ratio of glass which develops cracks at several percent or less by strictly controlling the sintering process. However, this is not practically applicable to largevolume commercial production. Introducing more coarse grains 50 microns or more in diameter into lead titanate to such a degree that the grains with larger diameters than 50 microns represent 5 percent or more, there develop no cracks which can be recognized with a naked eye, although minute cracks develop around the coarse grains.

It will be understood from the above explanation that desirable grain size distribution of lead titanate is such that grains of 5 microns or less in diameter represent 40 percent or less which those with the diameter of 50 microns or more cover 5 percent or less of the total lead titanate involved.

Lead titanate is produced by sintering at temperatures of 700° to 1,200°C a mixture of titanium oxide and lead oxide, a composite compound of titanium and lead obtained by the solution reaction process, or a mixture of the individual compounds. The filling material used in the invention takes the form of the grains physically pulverized. Lead titanate grains industrially produced have a large distribution of grain sizes, and therefore it is necessary to process pulverized grains through a sorting device in order to achieve the required grain size distribution. As the result of the study made by the inventors, it has been made clear that the ease with which the pulverization processes are controlled depends on the amount of lead oxide contained in lead titanate. Since lead titanate has a low rate of self-sintering, a sintered product is easily pulverized into minute grains of 5 microns or less in diameter. An increased ratio of lead oxide contained in lead titanate resulted in a greater strength of the sintered product, so that less part of the lead titanate could be pulverized into minute grains. In order to reduce the ratio of grains with the diameter of 5 microns or less to 40 percent or less, the inventors have found that it is necessary to maintain the ratio of lead oxide to titanium oxide at 1.1 or higher. Even though the increased ratio between lead oxide and titanium oxide facilitates the production of coarse grains, the sintering of a mixture of lead oxide, titanium oxide and glass material affects the quality of part of the glass due to excessive dissolution of lead oxide in the glass on one hand, while increasing the coefficient of thermal expansion of lead titanate, offsetting the advantages that are expected to be obtained by the addition of such components to glass. In view of this, it is undesirable to add an excessive amount of lead oxide, but the experiments by the inventors show that the ratio of lead oxide to titanium oxide should preferably be 5 or less. Especially, it has been found that the ratio of 2 or less is optimum for the purpose of industrial production.

It will be noted from the above explanation that the grain size distribution in which grains of 5 microns or less in diameter represent 40 percent or less and a desirable granular form without losing the advantage of addition to the glass material are obtained by maintaining a ratio of lead oxide to titanium oxide at 1.1 to 5 or preferably at 1.1 to 2.

If quartz glass is used as the filling material, it is desirable that grains of the quartz 5 to 50 microns in diameter represent 5 to 20 percent of the glass material. The reasons for the noted figures of percent will be explained below.

As a material covering the rectifier unit, glass is required to maintain a stable exposed surface of the PN junction or dynamic characteristics of the rectifier unit and to have the coefficient of thermal expansion approximate to that of the rectifier unit. It has been ascertained that quartz glass grains of 5 microns or less in diameter is "fused" in the glass material, thus eliminating the advantage of addition. If the grain diameter of the quartz glass is 50 microns or more, on the other hand, the exposed surface of the PN junction is adversely affected, resulting in an inferior characteristic of reverse current. In spite of the above definition of grain diameter of quartz glass, whether or not a desired advantage is achieved depends on the amount of the quartz glass added. When the granulated quartz glass represents 5 percent or less of the glass material, for example, there is no decrease seen in the coefficient of thermal expansion, while with the addition of granulated quartz glass 20 percent or more the reduction in the coefficient of thermal expansion reaches a saturated point, even reducing the reverse current characteristic. Therefore, it will be seen that if granulated quartz glass is employed as a filling material, its grain size distribution must be such that quartz glass grains 5 to 50 microns in diameter added to the glass material represent 5 to 20 percent of the galss material.

Figure 3:
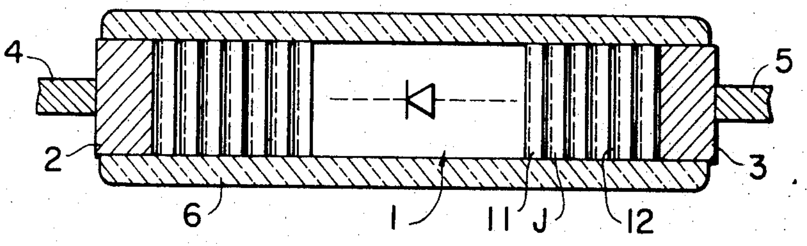
FIG. 3 is a schematic diagram showing a section of the glass mold semiconductor device according to the invention.

Embodiments of the invention will be now explained. Referring to FIG. 3 showing a glass mold semiconductor device according to the invention, reference numeral 1 shows a rectifier unit comprising a plurality of semiconductor pellets 11 each with a PN junction J with predetermined characteristics and a plurality of soldering layers 12 made of aluminum or the like interposed between the semiconductor pellets to form a laminated structure, and numerals 2 and 3 a couple of main electrodes provided on the soldering layers at the ends of the rectifier unit 1. The semiconductor pellets should preferably consist of silicon or germanium, while the main electrodes may be made of any conductors or preferably molybdenum, tungsten, fernico or other semiconductors with the coefficient of thermal expansion approximating that to the semiconductor pellets. Numerals 4 and 5 show lead wires connected to the main electrodes 2 and 3 respectively, and numeral 6 a mold glass covering the rectifier unit 1 and at least the rectifier unit side of the main electrodes 2 and 3, which mold glass, as already mentioned, has a coefficient of thermal expansion approximating that of the rectifier unit by addition of granulated lead titanate or quartz glass to glass of the zinc borosilicate group. A typical construction of the glass mold semiconductor device according to the invention is shown in FIG. 3, which may be modified in various ways without departing from the spirit of the invention. In one example, a plurality of semiconductor devices, each comprising the semiconductor device shown in FIG. 3, may be connected in parallel or in series to be integrally glass molded. In another example of such modifications, conductors which are adapted for use as main electrodes are interposed between the semiconductor pellets themselves or between the semiconductor pellets and the main electrodes to lengthen the creepage distance of the device.

EMBODIMENT 1

Cracks which have developed in mold glass of a semiconductor as shown in FIG. 3 comprising a glass material and granulated lead titanate 7 percent of the glass material are roughly divided into two types, of which the rate of occurrence as related to the distribution of lead titanate by grain diameter is shown in the table below.

| Grain size distribution | | Rate of occurrence of cracks (by ratio of qty. of products with cracks to qty. of specimens) | |
|---|---|---|---|
| 5 μ or less | 50 μ or more | large cracks | minute cracks |
| 30 % | 3 % | 0/850 | 0/850 |
| 10 | 5 | 0/1000 | 0/1000 |
| 45 | 3 | 1/750 | 0/749 |
| 60 | 0.2 | 11/800 | 0/789 |
| 75 | 0 | 86/200 | 0/114 |
| 10 | 8 | 0/500 | 60/500 |
| 0 | 15 | 0/100 | 100/100 |

EMBODIMENT 2

A frit comprising glass powder of zinc borosilicate group and 15 percent lead titanate powder added thereto is transformed into a slip, which was sprayed on the surface of the rectifier unit to deposit a layer about 150 microns thick. After this, the rectifier unit was sintered at 550°C. No cracks developed.

EMBODIMENT 3

Figure 4:
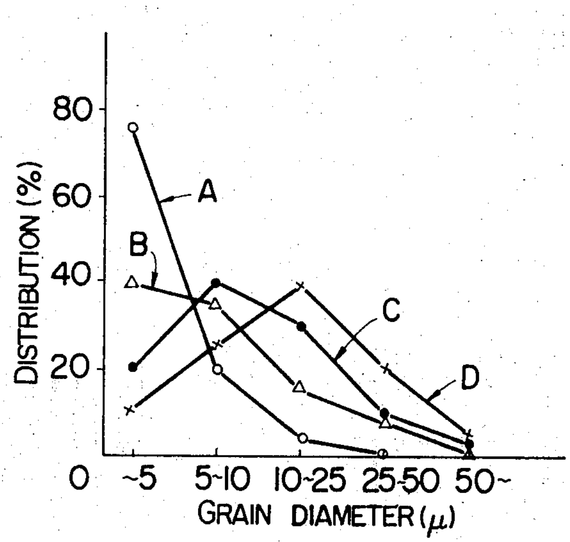
FIG. 4 is a characteristics diagram showing the distribution of grain sizes of pulverized lead titanate with the mixing ratios between lead oxide and titanium oxide as a parameter.

A mixture of lead oxide and titanium oxide in a predetermined ratio is provisionally sintered at 800°C and reduced to powder which is capable of passing through a 100-mesh screen. It is further molded into a block of about 50 $\phi \times 20$ mm and sintered holding it for an hour at 1,200°C. The sintered product is crushed in a stamp mill and then pulverized in a ball mill. The measurements of grain size distribution of the resulting product are shown in FIG. 4. In this figure, curves A, B, C and D correspond to the ratios of lead oxide to titanium oxide of 1.0, 1.1, 2 and 6 respectively. Also, curves A, B, C and D are associated with the pulverization periods in a ball mill of 1, 3, 4 and 12 hours respectively.

EMBODIMENT 4

Figure 5:
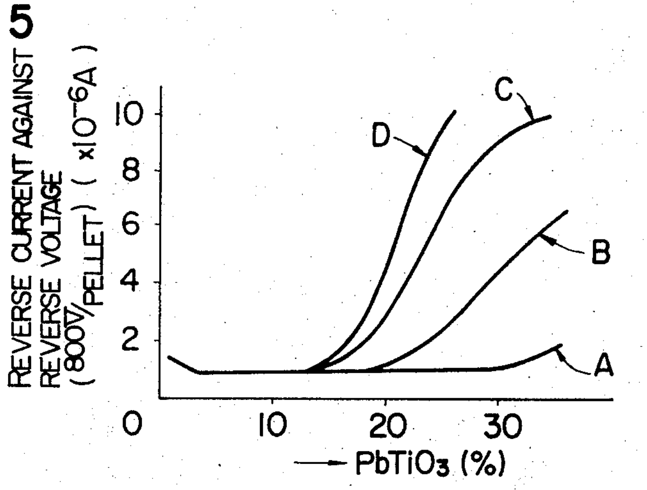
FIG. 5 is a characteristics diagram showing the relationship between the amount of lead titanate added to the glass of the zinc borosilicate group and the reverse current in the semiconductor device with the mixing ratios between lead oxide and titanium oxide as a parameter.

The graph of FIG. 5 shows the relationship between the amount of lead titanate added to the glass material and reverse current in embodiment 3. Curves A, B, C and D represent respectively the same ratios of PbO to $TiO_2$ as in FIG. 4.

We claim:

1. A glass mold semiconductor device comprising; a rectifier unit including a plurality of semiconductor pellets each having a PN junction, said plurality of semiconductors being bonded with each other into a laminated structure; a couple of electrodes bonded to the ends of said rectifier unit; and a mold glass including a glass material and a filling material for approximating the coefficient of thermal expansion of said glass material to that of said rectifier unit, said glass material containing glass of zinc borosilicate as its main component, said mold glass covering said rectifier unit and at least the rectifier unit side of said electrodes.

2. A glass mold semiconductor device according to claim 1, in which said filling material consists essentially of granulated lead titanate 5 to 30 percent by weight of said glass material.

3. A glass mold semiconductor device according to claim 2, in which the grain size distribution of said lead titanate is such that grains of 5 microns or less in diameter represent 40 percent or less of the whole lead titanate, while grains of 50 microns or more in diameter make up 5 percent or less thereof.

4. A glass mold semiconductor device according to claim 2, in which the ratio of lead oxide to titanium oxide contained in lead titanate ranges from 1.1 to 5.

5. A glass mold semiconductor device according to claim 1, in which said filling material consists essentially of granulated quartz glass 5 to 20 percent by weight of said glass material.

6. A glass mold semiconductor device according to claim 5, in which each grain of said quartz glass has the diameter of between 5 and 50 microns.

7. A glass mold semiconductor device comprising; a rectifier unit including a plurality of silicon or germanium pellets each with a predetermined PN junction and a plurality of soldering layers interposed between said pellets thereby to form a laminated structure; a couple of main electrodes consisting of conductors bonded to the ends of said rectifier unit, the coefficient of thermal expansion of said conductors approximating that of said pellets; and a mold glass including a glass material and a filling material for approximating the coefficient of thermal expansion of said glass material to that of said rectifier unit, said mold glass covering said rectifier unit and at least the rectifier unit side of said main electrodes, said glass material containing as its main component a glass of zinc borosilicate group consisting of, by weight, 60 to 70 percent of zinc oxide, 19 to 25 percent of boron oxide and 10 to 16 percent of silicon oxide.

8. A glass mold semiconductor device according to claim 7, in which said filling material consists essentially of granulated lead titanate 5 to 30 percent by weight of said glass material.

9. A glass mold semiconductor device according to claim 8, in which the grain size distribution of said lead titanate is such that grains of lead titanate of 5 microns or less in diameter represent 40 percent or less of the whole lead titanate, while those grains of lead titanate of 50 microns or more in diameter make up 50 percent or less.

10. A glass mold semiconductor device according to claim 8, in which the ratio of lead oxide to titanium contained in said lead titanate ranges from 1.1 to 5.

11. A high-voltage semiconductor device covered with a glass material comprising: a rectifier unit including a number of semiconductor pellets having a PN junction, said semiconductor pellets being bonded with each other into a laminated structure; electrodes bonded to the ends of said rectifier units; and a glass material covering said rectifier unit and at least a portion of the electrodes in close contact with said rectifier unit, said glass material comprising a fused mixture of (a) a zinc borosilicate glass comprising on an oxide basis at least 90 percent by weight of the combination of zinc oxide, boron oxide and silicon oxide and (b) 5 to 30 percent by weight based on the weight of the glass material of granulated lead titanate, said granulated lead titanate being distributed in the glass material whereby the coefficient of the thermal expansion of the glass material approaches the coefficient of thermal expansion of the rectifier unit.

12. The high-voltage semiconductor device of claim 11, wherein the zinc borosilicate glass consists essentially of on an oxide basis 60 to 70 weight percent zinc oxide, 19 to 25 weight percent boron oxide, and 10 to 16 weight percent silicon oxide, the remainder consisting essentially of lead oxide and aluminum oxide.

13. A high-voltage semiconductor device according to claim 11, wherein said fused mixture is made from granulated lead titanate in which no more than about 40 percent of said granulated lead titanate has a grain size of less than about 5 microns, and no more than about 5 percent of said lead titanate has a grain size larger than about 50 microns.

14. A high-voltage semiconductor device according to claim 11, in which the lead titanate has a lead oxide/-titanium oxide ratio of from 1.1 to 5.

15. A high-voltage semiconductor device covered with a glass material comprising: a rectifier unit including a number of semiconductor pellets having a PN junction, said semiconductor pellets being bonded with each other into a laminated structure; electrodes bonded to the ends of said rectifier unit; and a glass material covering said rectifier unit and at least a portion of the electrodes in close contact with said rectifier unit, said glass material comprising a fused mixture of (a) a zinc borosilicate glass consisting essentially of on an oxide basis 60 to 70 weight percent zinc oxide, 19 to 25 weight percent boron oxide and 10 to 16 weight percent silicon oxide, at least 90 percent of the zinc borosilicate glass being made from zinc oxide, boron oxide and silicon oxide, said zinc borosilicate glass further including lead oxide and aluminum oxide, and (b) 5 to 30 percent by weight based on the weight of said glass material of granulated lead titanate, said granulated lead titanate being distributed in the glass material whereby the coefficient of thermal expansion of the glass material approaches the coefficient of thermal expansion of the rectifier unit.

16. A high-voltage semiconductor device according to claim 15, wherein said fused mixture is formed from granulated lead titanate in which no more than 40 percent of the granulated lead titanate has a grain size of 5 microns or less and no more than 5 percent of the granulated lead titanate has a grain size of 50 microns or more.

17. A high-voltage semiconductor device according to claim 15, wherein said granulated lead titanate has a lead oxide/titanium oxide ratio of about 1.1 to 5.

18. A high-voltage semiconductor device covered with a glass material comprising: a rectifier unit including a number of semiconductor pellets having a PN junction, said semiconductor pellets being bonded with each other into a laminated structure; electrodes bonded to the ends of said rectifier unit; and a glass material covering said rectifier unit and at least a portion of the electrodes in close contact with said rectifier unit, said glass material comprising a fused mixture of (a) a zinc borosilicate glass comprising on an oxide basis at least 90 percent by weight of the combination of zinc oxide, boron oxide and silicon oxide, and (b) 5 to 20 percent by weight based on the weight of said glass material of granulated quartz glass, said granulated quartz glass being distributed in the glass material whereby the coefficient of thermal expansion of the glass material approaches the coefficient of thermal expansion of the rectifier unit.

19. A high-voltage semiconductor device according to claim 18, wherein said zinc borosilicate glass consists essentially of on an oxide basis 60 to 70 percent by weight zinc oxide, 19 to 25 percent by weight boron oxide and 10 to 16 percent by weight silicon oxide, the remainder consisting essentially of lead oxide and aluminum oxide.

20. The high-voltage semiconductor device according to claim 18, wherein said fused mixture is made from granulated quartz glass having a grain size of about 5 to 50 microns.

21. A high-voltage semiconductor device covered with a glass material comprising: a rectifier unit including a number of semiconductor pellets having a PN junction, said semiconductor pellets being bonded with each other into a laminated structure; electrodes bonded to the ends of said rectifier unit; and a glass material covering said rectifier unit and at least a portion of the electrodes in close contact with the rectifier unit, said glass material comprising a fused mixture of (a) a zinc borosilicate glass consisting essentially of on an oxide basis 60 to 70 weight percent zinc oxide, 19 to 25 weight percent boron oxide and 10 to 16 weight percent silicon oxide, at least 90 percent of the zinc borosilicate glass being made from zinc oxide, boron oxide and silicon oxide, said zinc borosilicate glass further including lead oxide and aluminum oxide, and (b) 5 to 20 percent by weight based on the weight of said glass material of granulated quartz glass, said granulated quartz glass being distributed in the glass material whereby the coefficient of thermal expansion of the glass material approaches the coefficient of thermal expansion of the rectifier unit.

22. A high-voltage semiconductor device according to claim 21, wherein said fused mixture is made from glass quartz having a grain size of about 5 to 50 microns.

23. The high-voltage semiconductor device of claim 21, wherein the thickness of said glass material is about 150 microns.

24. The high-voltage semiconductor device of claim 18, wherein the thickness of said glass material is about 150 microns.

25. The high-voltage semiconductor device of claim 15, wherein the thickness of said glass material is about 150 microns.

26. The high-voltage semiconductor device of claim 11, wherein the thickness of said glass material is about 150 microns.

* * * * *